United States Patent
Blyth et al.

(10) Patent No.: US 9,800,206 B2
(45) Date of Patent: Oct. 24, 2017

(54) SIGNAL ENVELOPE PROCESSING

(71) Applicant: Cirrus Logic International Semiconductor Ltd., Edinburgh (GB)

(72) Inventors: Malcolm Blyth, Dunfermline (GB); Graeme Gordon Mackay, Dunfermline (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/165,737

(22) Filed: May 26, 2016

(65) Prior Publication Data

US 2016/0276984 A1    Sep. 22, 2016

Related U.S. Application Data

(63) Continuation of application No. 14/322,747, filed on Jul. 2, 2014, now Pat. No. 9,362,875.

(30) Foreign Application Priority Data

Jul. 5, 2013  (GB) .................................. 1312088.6

(51) Int. Cl.
| | |
|---|---|
| *H03F 1/02* | (2006.01) |
| *H03F 3/68* | (2006.01) |
| *H03F 3/183* | (2006.01) |

(52) U.S. Cl.
CPC .......... *H03F 1/0227* (2013.01); *H03F 3/183* (2013.01); *H03F 3/68* (2013.01); *H03F 2200/03* (2013.01); *H03F 2200/102* (2013.01)

(58) Field of Classification Search
CPC .......... H03F 1/0227; H03F 3/183; H03F 3/68; H03F 2200/03; H03F 2200/102
(Continued)

(56) References Cited

U.S. PATENT DOCUMENTS

| | | | |
|---|---|---|---|
| 6,236,864 B1* | 5/2001 | McGowan | H04B 1/707 375/296 |
| 7,239,258 B2 | 7/2007 | Grosso et al. | |

(Continued)

FOREIGN PATENT DOCUMENTS

| | | |
|---|---|---|
| GB | 2451524 A | 2/2009 |
| WO | 2009111500 A2 | 9/2009 |

OTHER PUBLICATIONS

Search Report, Application No. GB1312088.6, dated Dec. 19, 2013, 2 pages.

*Primary Examiner* — John Poos
(74) *Attorney, Agent, or Firm* — Jackson Walker L.L.P.

(57) ABSTRACT

Methods and apparatus for detection and tracking of a signal envelope. The circuit comprises absolute value circuitry configured to receive data samples and output a first value corresponding to the magnitude of said data samples. An envelope tracker maintains an envelope output value and compares the first value to the current envelope output value and modifies the envelope output value based on said comparison to provide the envelope output value with predetermined attack and decay characteristics. The absolute value circuitry has a first input for receiving a first digital signal at a first sample rate and a second input for receiving an interpolated version of the first digital signal at a second sample rate which is higher than the first sample rate and outputs the first value based on the magnitudes of the samples received at the first input and the samples received at the second input. Using the first digital signal provides an early indication of any increases in signal envelope whereas the second digital signal can allow a more accurate estimation.

20 Claims, 5 Drawing Sheets

(58) Field of Classification Search
USPC .............................................. 327/58, 59, 62
See application file for complete search history.

(56) References Cited

U.S. PATENT DOCUMENTS

| | | |
|---|---|---|
| 7,498,876 B2 | 3/2009 | Peruzzi et al. |
| 7,519,336 B2 | 4/2009 | Vepsalainen et al. |
| 2011/0216639 A1 | 9/2011 | Tomikawa et al. |

* cited by examiner

SIGNAL ENVELOPE PROCESSING

This application is a continuation of U.S. Non-Provisional Application No. 14/322,747, filed on Jul. 2, 2014, which claims the benefit of United Kingdom Patent Application No. 1312088.6, filed on Jul. 5, 2013, both of which are incorporated by reference herein in their entirety.

BACKGROUND OF THE INVENTION

1. Field of the Invention

This application relates to signal envelope processing, in particular to the rapid and accurate detection of increases in a digital signal envelope.

2. Description of the Related Art

There are a number of different applications in which it desired to monitor the envelope of a digital signal in order to control downstream processing or adjust the settings of downstream circuitry. By envelope is meant an indication of the signal amplitude and/or peak magnitude of the signal waveform represented by the data of the digital signal.

For example in class G amplifier circuits a digital audio signal may be received by an audio amplification circuit where the power supply to at least one amplifier stage is controlled based on the envelope of the signal to be amplified. The power supply voltage is maintained at a level so that there is sufficient headroom for the signal to be amplified but when the input signal level reduces, the supply voltage also reduces when possible so as to reduce the power that has to be supplied to provide a required current in the load and thus increase efficiency.

FIG. 1 shows an example of a Class G audio amplification circuit. A digital audio input signal $D_{in}$ is received at a sample rate $f_s$. This digital input signal may be interpolated by interpolator 101 to an increased sample rate $n.f_s$ (e.g. $64.f_s$) before being converted to an analogue signal by Digital-to-Analogue Converter (DAC) 102. The analogue signal may then be amplified by amplifier 103 and provided to an output say connected to loudspeaker 104. The supply voltage to at least one element of the amplifier output, say at least an output stage of the DAC 102 and/or amplifier 103 may be varied by a variable voltage power supply unit 104. The voltage of the power supply unit may be controlled in response to the envelope of the signal to be amplified so that the supply voltage may be reduced when possible when amplifying lower envelope signals to save power. An envelope detector 105 of some sort must therefore be used to determine the signal envelope.

For increases in signal amplitude resulting in a requirement to increase the supply voltage to an amplifier stage, the supply voltage should be increased before the increased amplitude signal arrives to avoid any issues with signal clipping. The envelope detector therefore typically has a fast attack time constant and monitors the signal at a point upstream of the components to which the power supply may be varied. Typically there may be very little propagation delay between the output of interpolator 101 and the output stage of the DAC 102 or the amplifier 103 thus leaving very little time to detect and act upon any increases in signal envelope. The propagation delay between the interpolator 101 and DAC 102 could be increased by using specific delay elements in the signal path but such delay elements will increase the size and cost of the amplifier circuit and are generally avoided. Thus the envelope detector may monitor the envelope of the input digital signal prior to interpolation.

Using the input signal prior to interpolation may however result in an underestimation of the actual signal envelope as illustrated in FIG. 2.

FIG. 2 illustrates an input signal which in this example is a sinusoidal input at a frequency of $f_s/4$. For typical audio sample rates, e.g. 48 kHz or 44.1 kHz, this would correspond to a sinusoidal input at around 10 kHz. As the input signal has a frequency of $f_s/4$ there will be four samples per cycle. FIG. 2 illustrates the difference in maximum sample value where the samples are acquired with no phase lag, i.e. one sample corresponds to the peak signal value, compared to sample acquired with a 45° phase lag. In the latter case the maximum sample value will be −3 dB lower than the actual peak signal value.

Thus using the base sample rate to determine the envelope of an interpolated signal may result in the determined envelope being underestimated.

Envelope detection may also be used in Dynamic Range Enhancement (DRE) which is a technique to improve noise performance at low signal levels. In DRE the magnitude of gain provided by a digital gain element is varied so as to fully utilise the input range of a DAC, as illustrated in FIG. 3. An input digital signal $D_{in}$ may be received at a sample rate $f_s$ and interpolated to a sample rate $n.f_s$, say $64f_s$. In the example of FIG. 3 there is a two-stage interpolation process, a first interpolator 101 a interpolates to an intermediate sample rate $m.f_s$ which may, for example be $4f_s$ before a second stage interpolator produces the signal at $n.f_s$. A digital gain $G_{DIG}$ is applied to the signal before it is input to DAC 102. The digital gain applied is adjusted based on the signal level so that the full input range of the DAC 102 is used but not exceeded. For low amplitude signals the digital gain may thus be increased to make more use of the input range of the DAC. The analogue output signal from DAC 102 is amplified by variable gain amplifier 103 and may be supplied to a speaker 104. The analogue gain applied, $G_{ANA}$, compensates for the digital gain and thus the analogue gain variation may be the inverse of the digital gain variation. Thus for a low amplitude input digital signal the analogue gain applied after the DAC is reduced to compensate for the increased digital gain applied prior to the DAC. This has the effect that the overall gain of the signal processing chain remains substantially constant but the low analogue gain reduces the quantisation and thermal noise of the DAC appearing at the output for low amplitude signals. An envelope detector 105 is thus used to determine the envelope of the digital signal which is used by gain allocation unit 301 to control the allocation of digital and analogue gain. In DRE the interpolated signal at $n.f_s$ may be input to the envelope detector to ensure that the gain is allocated correctly. However as mentioned above this requires very quick identification of any increase in signal envelope so the digital gain can be lowered appropriately to avoid signal clipping. This also requires the envelope detector to operate at the high sample rate, consuming extra power and chip area.

SUMMARY OF THE INVENTION

Embodiments of the present invention relate to methods and apparatus for signal envelope detection that at least mitigate some of the above of the above mentioned problems.

Thus according to the present invention there is provided an envelope detection circuit comprising:

absolute value circuitry configured to receive data samples and output a first value corresponding to the magnitude of said data samples; and an envelope tracker configured to maintain an envelope output value and to compare the first value to the current envelope output value and modify the envelope output value based on said comparison to provide the envelope output value with predetermined attack and decay characteristics;

wherein the absolute value circuitry comprises a first input for receiving a first digital signal at a first sample rate and a second input for receiving an interpolated version of the first digital signal at a second sample rate which is higher than the first sample rate and is configured to output said first value based on the magnitudes of the samples received at the first input and the samples received at the second input.

The envelope tracker may comprise: attack circuitry for increasing the envelope output value; and decay circuitry for decreasing the envelope output value; wherein the attack circuitry operates in response to a first clock signal and the decay circuitry operates in response to a frame clock signal which has a rate slower than the first clock signal.

The attack circuitry may be configured to compare the first value to the envelope output value to determine whether the envelope output value should be increased and, if so, to increase the envelope output value to correspond to the first value. The decay circuitry may be configured to determine if the first value was lower than the envelope output value for a predetermined number of successive frame periods defined by the frame clock signal and, if so, to decrease the envelope output value.

In some embodiments the frame period is equal to the period between successive samples at the first sample rate.

The absolute value circuitry may comprise a maximum value detector configured to receive samples from both said first input and said second input and maintain said first value corresponding to the maximum magnitude value of any sample received within a frame period defined by said frame clock signal. The maximum value detector may be configured such that the first value is updated at any time in a frame period if a sample with a value greater than the current first value is received during the frame period. The attack circuitry may then be configured such that the envelope output value may be updated at any time if the first value increases to a value greater than the current envelope output value during the frame period. In some embodiment the attack circuitry is configured such that the envelope output value is only increased if the first value is greater than the envelope output value by a predetermined amount. The decay circuitry may be configured to compare the first value at the end of a frame period to the envelope output value so as to detect if the first value was lower than the envelope output value for that frame period. In some embodiments the envelope output value is only decreased if the first value is lower than the envelope output value by a predetermined amount for said predetermined number of successive frame periods.

The attack circuitry may be configured to detect if the first value is greater than or equal to the envelope output value and, if so, output a first control signal and the decay circuitry is responsive to said first control signal to determine if the first value was lower than the envelope output value for that frame period. The first control signal may set a status flag which is interrogated and reset by the decay circuitry once in every frame period.

The decay circuitry may be configured to compare the envelope output value at the end of a frame period to a held envelope value corresponding to the envelope output value at the start of that frame period so as to detect if the first value was lower than the envelope output value for that frame period.

The decay circuitry may comprise hold circuitry, the hold circuitry comprising a counter configured to count the number of successive frame periods in which the first value was lower than the envelope output value, wherein the counter is reset to a starting value following or during any frame period in which the frame maximum value is not lower than the envelope output value. The counter may be configured to count each frame period and to be reset by said first control signal. The decay circuitry may comprise decrement circuitry configured to decrease the value of the envelope output value by a predetermined amount if the counter has reached a specified count value. The predetermined amount may vary over time to provide an exponential decay.

The second sample rate may be at least two times, or at least four times, higher than the first sample rate.

The absolute value circuitry may comprise a multiplexor having inputs coupled to said first and second inputs and configured to produce a data stream consisting of samples received from the first input interspersed with samples received from said second input. In some embodiments at least one pre-emphasis filter may be arranged to filter the data signals received at at least one of the first and second inputs to emphasise any increase in signal level.

The envelope detection circuit may be used in signal processing circuit comprising: a first signal path input for receiving the first digital signal; and a first interpolator configured to interpolate the first digital signal to generate a second digital signal at the second sample rate; wherein the first input of the envelope detector is configured to receive the first digital signal and the second input of the envelope detector is configured to receive the second digital signal. There may additionally be a digital-to-analogue converter configured to receive a digital signal based on the second digital signal and generate a first analogue signal; and an amplifier configured to amplify the first analogue signal. A power controller may be provided for controlling the power supply to at least one of the digital-to-analogue converter and the amplifier based on the envelope output value. There may also be a digital variable gain element for applying a digital gain to the signal received by the digital-to-analogue converter; an analogue variable gain element for applying an analogue gain to the first analogue signal produced by the digital-to-analogue converter; and a gain controller for controlling the allocation of gain between the digital variable gain element and the analogue variable gain element based on the envelope output value.

In some embodiments a second interpolator may be configured to interpolate the second digital signal to generate an interpolated version of the second digital signal at a third sample rate, which is higher than the second sample rate wherein the digital-to-analogue converter is configured to receive the interpolated version of the second digital signal. There may additionally or alternatively be an initial interpolator, wherein the first signal path input is located at the output of the initial interpolator and the initial interpolator is configured to produce the first digital signal from an initial input signal.

The envelope detection circuit or signal processing may be implemented as an integrated circuit. The envelope detection circuit or signal processing may be implemented within an electronic device which may be at least one of: an audio device; a portable device; a communications device; a computing device; a battery powered device; an audio player; a video player; a gaming device; a mobile telephone; a laptop, notebook or tablet computer.

The invention also provides a method of envelop detection comprising:
receiving input data samples at absolute value circuitry and outputting a first value corresponding to the magnitude of said data samples; maintaining an envelope output value; and
comparing the first value to the current envelope output value and modifying the envelope output value based on said comparison to provide the envelope output value with predetermined attack and decay characteristics;
wherein the absolute value circuitry receives a first digital signal at a first sample rate and also an interpolated version of the first digital signal at a second sample rate which is higher than the first sample rate and outputs said first value based on the magnitudes of the samples of first digital signal and the interpolated version of the first digital signal.

In a further aspect of the invention there is provided an envelope detection circuit comprising:
a first input for receiving a first digital signal at a first sample rate;
a second input for receiving an interpolated version of the first digital signal at a second sample rate which is higher than the first sample rate;
a maximum value detector configured to receive samples from both said first input and said second input and maintain a frame maximum value corresponding to the maximum magnitude value of any sample received within a frame period; and
an envelope tracker configured to receive the frame maximum value and output an envelope output value, the envelope tracker comprising:
attack circuitry configured to detect if the frame maximum value is greater than the envelope output value and, if so, to increase the envelope output value to correspond to the frame maximum value; and
decay circuitry configured to detect if the frame maximum value is lower than the envelope output value for a predetermined number of successive frame periods and, if so, to decrease the envelope output value.

The invention also provides, in another aspect, an envelope detection circuit comprising: a first input for receiving a first digital signal at a first sample rate; a second input for receiving a second digital signal at a second sample rate which is higher than the first sample rate; a maximum value detector configured to receive samples from both said first input and said second input and maintain a frame maximum value corresponding to the maximum value of any sample received within a frame period; and an envelope tracker configured to receive the frame maximum value and output an envelope output value.

In a further aspect there is provided an envelope detection circuit comprising:
a first input for receiving a first digital signal at a first sample rate;
a second input for receiving an interpolated version of the first digital signal at a second sample rate which is higher than the first sample rate;
attack circuitry configured to increase an envelope output value if any sample has a value greater than the current envelope output value; and
decay circuitry configured to decrease the envelope output value if no sample has a value greater than the current envelope output value for a predetermined period of time;
wherein the attack circuitry is configured to operate at a first clock speed which is greater than the second sample rate and the decay circuitry is configured to operate at a second clock speed which is slower than the first clock speed.

In a yet further aspect there is provided an audio amplifier circuit having a signal path comprising:
a first interpolator configured to receive a digital audio signal and produce an interpolated version at a faster sample rate;
a digital-to-analogue converter downstream in the signal path from the first interpolator;
an analogue amplifier downstream in the signal path from the digital-to-analogue converter;
an envelope detector configured to receive a first signal from the signal path before said first interpolator and a second signal from the signal path before said first interpolator and to produce an envelope value based on the greatest magnitude value of both the first signal and the second signal; and
a controller for controlling at least one setting of at least one component of the amplifier circuit based on said envelope value.

The at least one setting may comprises at least one of: bias, variable gain setting; switching speed; and switch size. There may also be a power supply for supplying at least one supply voltage to at least the analogue amplifier wherein the at least one setting comprises at least one of: the supply voltage; the switching speed of the power supply; and the switch size used in the power supply.

BRIEF DESCRIPTION OF THE DRAWINGS

The invention will now be described by way of example only with respect to the following drawings, of which.

DETAILED DESCRIPTION OF THE PREFERRED EMBODIMENTS

As discussed above in some signal processing applications especially in audio reproduction, an input digital signal may be interpolated for subsequent processing and an envelope detector may be used to track the signal envelope in order to control various settings of the signal processing circuit. For example in a Class G audio amplifier the supply voltage to one or more components may be varied in line with the signal to be amplified so as to save power where possible. Where a switched power supply such as a charge pump is used as the power supply for an audio amplifier it is also known to vary the switching speed or switch size used in the charge pump based on the envelope of the audio signal to be amplified. The bias applied to a component, e.g. bias current or bias voltage, may also take account of the signal envelope. Additionally or alternatively, as discussed above in respect of Dynamic Range Extension, a variable digital gain may be applied before a DAC to make full use of the DAC input range for low amplitude signals with an inverse analogue gain being applied to compensate and reduce noise for low level signals.

In such applications it is generally advantageous to have as much warning as possible of any increases in signal level. As mentioned above there is typically not much propagation delay between the output of the interpolator and the components for which the settings are being controlled. This may be a problem, for example in the Class G example where the power supply may take some time to attain an increased supply voltage. Adding specific delay or pipeline stages to the digital signal path adds the size and cost of the circuitry. The signal envelope could instead be determined based on the input signal before interpolation but this can lead to underestimation of the peaks of the interpolated signal.

Embodiments of the present invention relate to envelope detection which monitors both a digital signal prior to interpolation and an interpolated version of the digital signal in order to determine an envelope output value. As there will be inherent propagation delays associated with the interpolation using the digital signal before interpolation provides an early indication of any increase in signal amplitude. However by also using the interpolated signal a more accurate signal peak level can be determined, reducing the chance of an incorrect setting leading to signal clipping or similar artefacts. In effect the envelope detection provides both an early, possibly coarse, indication of any signal increases along with a later, more accurate indication. Embodiments of the present invention therefore relate to envelope detector circuits that are capable of deriving signal information, such as an envelope value, from data at two different sample rates, for instance from data before and after an upsampling or interpolation stage.

Figure 1:
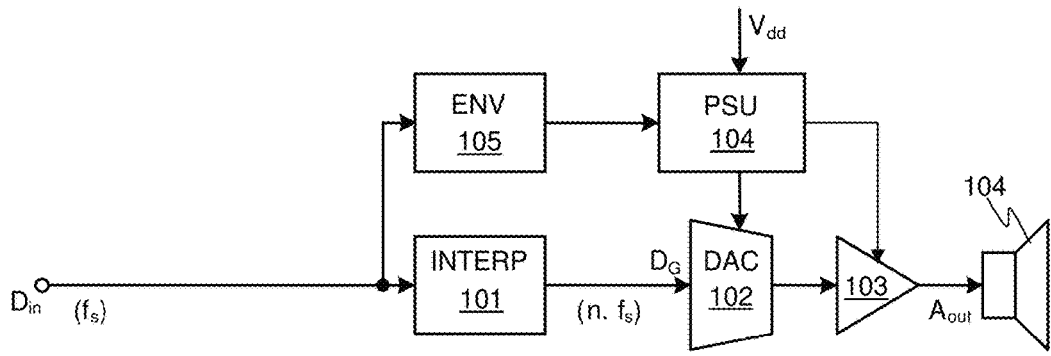
FIG. 1 illustrates the principles of a Class G amplifier circuit.
Figure 2:
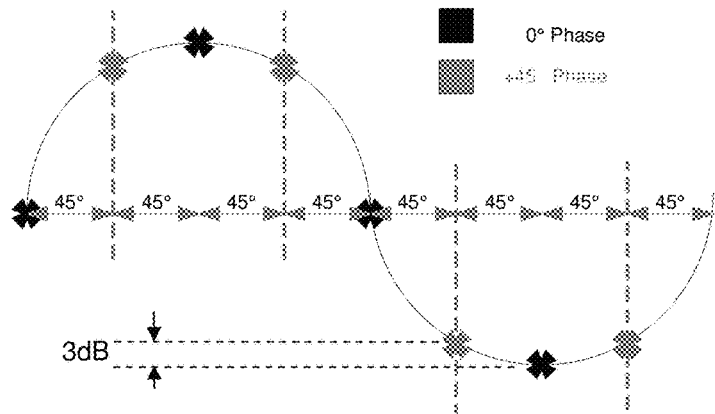
FIG. 2 illustrates how an envelope detector acting on a digital signal at a base sample rate can underestimate the envelope of an interpolated signal.
Figure 3:
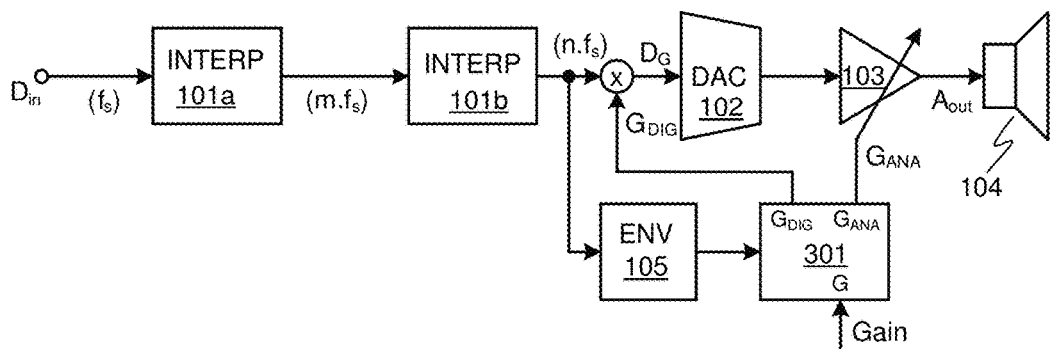
FIG. 3 illustrates the principles of a Dynamic Range Enhancement processing circuit.
Figure 4:
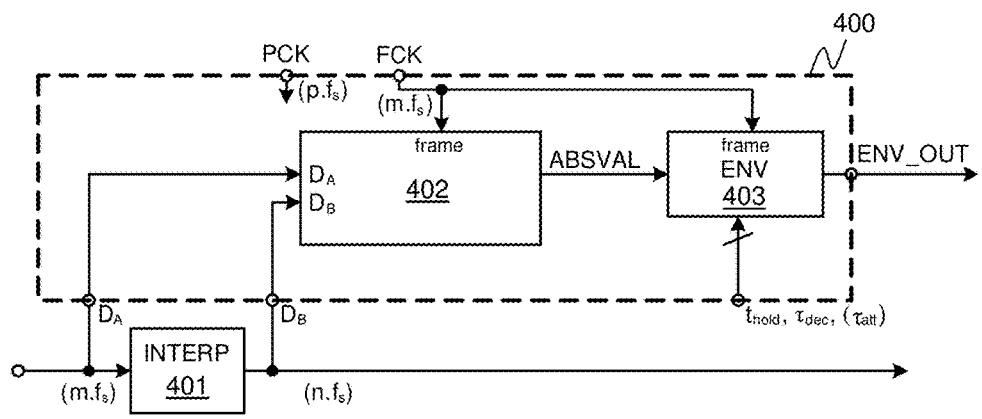
FIG. 4 illustrates an envelope detector according to an embodiment of the invention.

FIG. 4 illustrates an envelope detection circuit 400 according to an embodiment of the invention. The circuit 400 comprises a first input $D_A$ for receiving a first digital signal at a first sample rate $m.f_s$ and also a second input $D_B$ for receiving an interpolated version of the first digital signal at a second sample rate $n.f_s$ which is higher than the first sample rate, i.e. n>m. It will be appreciated that the samples received at the second input $D_B$ will be delayed with respect to the samples at the first input $D_A$ due to the delays inherent in interpolation. In this example the first and second inputs $D_A$ and $D_B$ tap signals from a signal path before and after a first interpolator 401.

To provide the envelope detection the circuit comprises absolute value circuitry 402 configured to output a first value ABSVAL corresponding to the magnitudes of samples received from both said first input $D_A$ and said second input $D_B$. In this embodiment the absolute value circuitry 402 is a maximum value detector which is configured to receive samples from both the first input $D_A$ and the second input $D_B$ and determine which sample, from any input ($D_A$, $D_B$) within a frame period, has the maximum magnitude value.

In this embodiment the maximum value detector maintains the first value as a frame maximum value, ABSVAL, corresponding to the maximum absolute value of any sample received within the frame period. The frame period may be defined by a frame clock FCK which may be set so that there is at least one sample from the first input in each frame. In this embodiment the frame clock FCK may be set to be the same as the first sample rate $m.f_s$, i.e. the frame period is equal to the period between successive samples at the first sample rate $m.f_s$, so that there is only one sample from the first input per frame—along with n/m samples from the second input.

An envelope tracker 403 is configured to receive the first value, i.e. ABSVAL, and output an envelope output value, ENV_OUT. The envelope tracker 403 maintains the envelope output value and compares the first value, i.e. ABSVAL, to the current envelope output value and modifies the envelope output value based on said comparison to provide the envelope output value with predetermined attack and decay characteristics.

The envelope tracker 403 may comprise attack circuitry for increasing the envelope output value. The attack circuitry may be configured to compare the first value ABSVAL to the envelope output value ENV_OUT to determine whether the envelope output value should be increased and, if so, to increase the envelope output value ENV_OUT to correspond to the first value. In embodiments where a fast response to increases in signal amplitude is important the attack circuitry may simply immediately (possibly subject to normal propagation and synchronisation delays) replace the current envelope value with the higher value first value. In such embodiments the attack circuitry provides the envelope output value with an attack characteristic with an attack time constant substantially equal to zero. However if desired (for example to reduce the effect of anticipated isolated spikes in the incoming data) the attack circuitry may be able to implement a non-zero attack time constant setting $\tau_{att}$, which may be configurable. In some embodiments the attack circuitry may be configured such that the envelope output value is only increased if the first value is greater than the envelope output value by a predetermined amount. This may implement a degree of hysteresis.

The envelope tracker 403 may also comprise decay circuitry configurable to detect if the first value ABSVAL is lower than the envelope output value ENV_OUT for a predetermined number of successive frame periods defined by a frame clock signal FCK and, if so, to decrease the envelope output value ENV_OUT at a rate or method which may be predetermined or may be configurable by the user..

The predetermined number of frame periods for which the first value must remain below the envelope output value ENV_OUT before the envelope output value ENV_OUT is decreased may define a hold time, $t_{hold}$. If no hold were required the predetermined number of frames could be set to "1" (one) so that the envelope value is decreased at the end of any frame in which the first value is lower than the current envelope output value. The amount by which the envelope output value is decreased per frame may be determined by e.g. a decay time constant setting $\tau_{dec}$ which may be configurable and which may, in some embodiments, be changed during operation. The amount of any hold and any decay time constant provide the predetermined decay characteristic.

It will be apparent that with a frame clock FCK equal to the first sample period the maximum value detector 402 must be able to operate to process one data sample from the first input and n/m data samples from the second input each frame. To process these samples serially, the maximum value detector may thus operate with a fast processor clock, PCK, with clock rate $p.f_s$ which is greater than $n.f_s$: the frequency multiplication factor p has to be at least equal to n+m to allow both data streams to be processed, and typically n will be a power of 2 and p equal to 2.n. However in some embodiments at least some of the processing may be performed in parallel, reducing the necessary processing clock frequency.

Preferably the maximum value detector is configured such that the first value, i.e. the frame maximum value ABSVAL, is updated at any time in a frame period, i.e. without necessarily waiting for the end of the frame period, if any sample $D_A$ or $D_B$ with a magnitude value greater than the current frame maximum value is received during the frame period. In other words the maximum value detector 402 maintains the first value ABSVAL as a running indication of the maximum magnitude value of any sample received so far during that frame. This means that an increase in sample value magnitude is provided to the envelope tracker 403 as soon as detected rather than just at the end of a frame.

Likewise the attack circuitry of the envelope tracker 403 may be configured such that the envelope value ENV_OUT may be updated at any time in a frame period if the first value ABSVAL increases to a value greater than the current envelope output value during the frame period. This effectively means that as soon as a sample with a magnitude greater than the current envelope output value is received the envelope output value may be updated. In effect there is a pass-through for increases in signal magnitude: a sample of $D_A$ or $D_B$ larger than the recently detected envelope will propagate directly via ABSVAL to ENV_OUT, subject only to any propagation or re-synchronisation delay. This means that the attack circuitry may also be clocked at the rate of the fast clock, PCK.

The decay circuitry for applying the envelope decay and any hold could be run at the fast clock speed but typically the hold time and decay time constant are much longer than the period of the fast clock PCK. Therefore to reduce the need for fast circuitry, with the associated cost and power implications, the decay circuitry may be arranged to run at a slower clock speed and may run at the frame clock speed.

Thus the attack circuitry operates in response to a first clock signal, i.e. the fast clock signal, which is preferably at a rate which is at least as fast as the maximum update rate of the first value. However the decay circuitry may operate in response to a frame clock signal which has a rate slower than the first clock signal.

The decay circuitry may therefore be configured to compare the first value ABSVAL (which corresponds to the running maximum sample value) at the end of a frame period to the envelope output value ENV_OUT so as to detect if the first value is lower than the envelope output value for that frame period. It will be appreciated the envelope output value may, in some embodiments, never be lower than the first value ABSVAL at the end of the frame as any increase in ABSVAL would have caused ENV_OUT to be immediately updated within the frame period. Thus the decay circuitry need only determine whether the first value is lower than the envelope output value or the same as the envelope output value at the end of each frame period. In some embodiments, to implement hysteresis the decay circuitry may determine whether the first value is lower than the envelope output value by a predetermined amount. (In alternative embodiments of the decay circuitry the first value may be compared at the end of each frame period to a held envelope value corresponding to the envelope output value at the start of that frame period, in which case the first value could be greater than the held envelope value, and the decay circuitry would be required to handle this eventuality).

In further alternative embodiments, rather than generating a maximum value within the absolute value circuitry and then comparing this maximum value within the envelope detector, the magnitude of each input sample may be compared directly with the current envelope detector output. Increases in input signal propagate through directly, whereas decreases in signal control the decay circuitry on a frame by frame basis according to a logic flag.

For example, the attack circuitry, which compares the first value to the envelope output value, could be configured to determine whether the first value is greater than or equal to the envelope output value and output a control signal. This control signal could be used to set a status flag which would be read at the end of the frame period by the decay circuitry and reset for the next frame period. The status flag, which could for instance be the state of a flip-flop or a non-zero value in a counter, would then indicate whether the first value had remained below the envelope output value for the whole frame period. Alternatively the control signal may be used to reset a counter of the decay circuitry which is clocked each frame period. In other words the counter of the decay circuitry may be arranged to count each frame but in any frame in which the first value is not lower than the envelope output value the count value will be reset to a starting value. It will thus require a series of frames in which the first value was consistently lower than the envelope output throughout the entirety of those frame for the decay counter to reach a specified count value.

In this embodiment it would not be necessary for the absolute value circuitry to maintain a frame maximum value and the first value could simply comprise the absolute magnitude value of each sample, i.e. the first value is updated as each sample is processed whether or not the new sample magnitude is greater than the previous sample magnitude. The attack circuitry, clocked at the fast clock rate PCK, would just compare the absolute value of each sample with the current envelope value to determine whether it was greater than or equal to the envelope output value and output the control signal as necessary (and implement any increase in the envelope output value as needed). The decay circuitry would be clocked at the frame period and rely on the control signal having set a status flag or reset a count value.

As a further alternative the envelope output value at the end of the frame could be compared to a held envelope value from the start of the frame. This would indicate whether the envelope output value had been increased during the frame period in response to a greater magnitude sample value being received. This embodiment would not however be able to determine whether a sample magnitude had been received that was the same as the current envelope value, or whether the envelope output value was just being held constant during the hold time—as in both cases the envelope output values at the start and end of the frame would be the same. This could mean that for a signal where no received sample has a magnitude which exceeds the current envelope value but some sample magnitudes equal the envelope output value (e.g. a constant envelope signal) the decay circuitry may, in time, decrease the envelope output value in error. However for some applications with long decay time constants such behaviour may be acceptable. If the envelope output value is decreased in error the first sample above the reduced envelope output value will trigger an immediate increase and a reset of the hold counter.

In any case however it will be appreciated that the decay circuitry need only perform a check or comparison at the frame rate. This means that the hold and decay processing can be implemented using circuitry operated at the slower frame clock rate. This will reduce the size of counters etc. required and economically allow implementation of relatively long holds and/or decay time constants.

In whatever way it is implemented, the decay circuitry will decrease the envelope output value after a predetermined number of successive frames in which the first value was lower than, or at least has not exceeded, the envelope output value over the frame period. As mentioned above the predetermined number of frames may be set to be equal to one if no hold function were required, i.e. the envelope output value is decreased after just one instance of a frame in which the first value was lower than the envelope output for the whole frame. Typically however at least the ability to be configured in use to implement a hold function is desirable thus the decay circuitry may comprise hold circuitry even if sometimes not activated.

The hold control circuitry to implement this hold function may comprise a counter configured to count the number of successive frame periods in which the first value was determined to be lower than the envelope output value. The counter may be reset to a starting value following or during any frame period in which the first value is not lower than the envelope output value. Decrement circuitry may be configured to decrease the value of the envelope output value, in some predetermined fashion, if the counter has reached a specified count value. Thus the envelope output value will only be decreased if there is the required number of successive frames with no sample value exceeding the envelope output value for the counter to reach the required value. Once the specified count value is reached the envelope output value may be decreased in any specified way. For instance, a certain decrease in value may be applied each frame period until the next time the first value exceeds the envelope output value and the hold counter is reset to the starting value. Alternatively, the envelope output value may be decreased exponentially, according to a desired decay time constant, $T_{dec}$, towards zero or towards the current envelope value.

Figure 5:
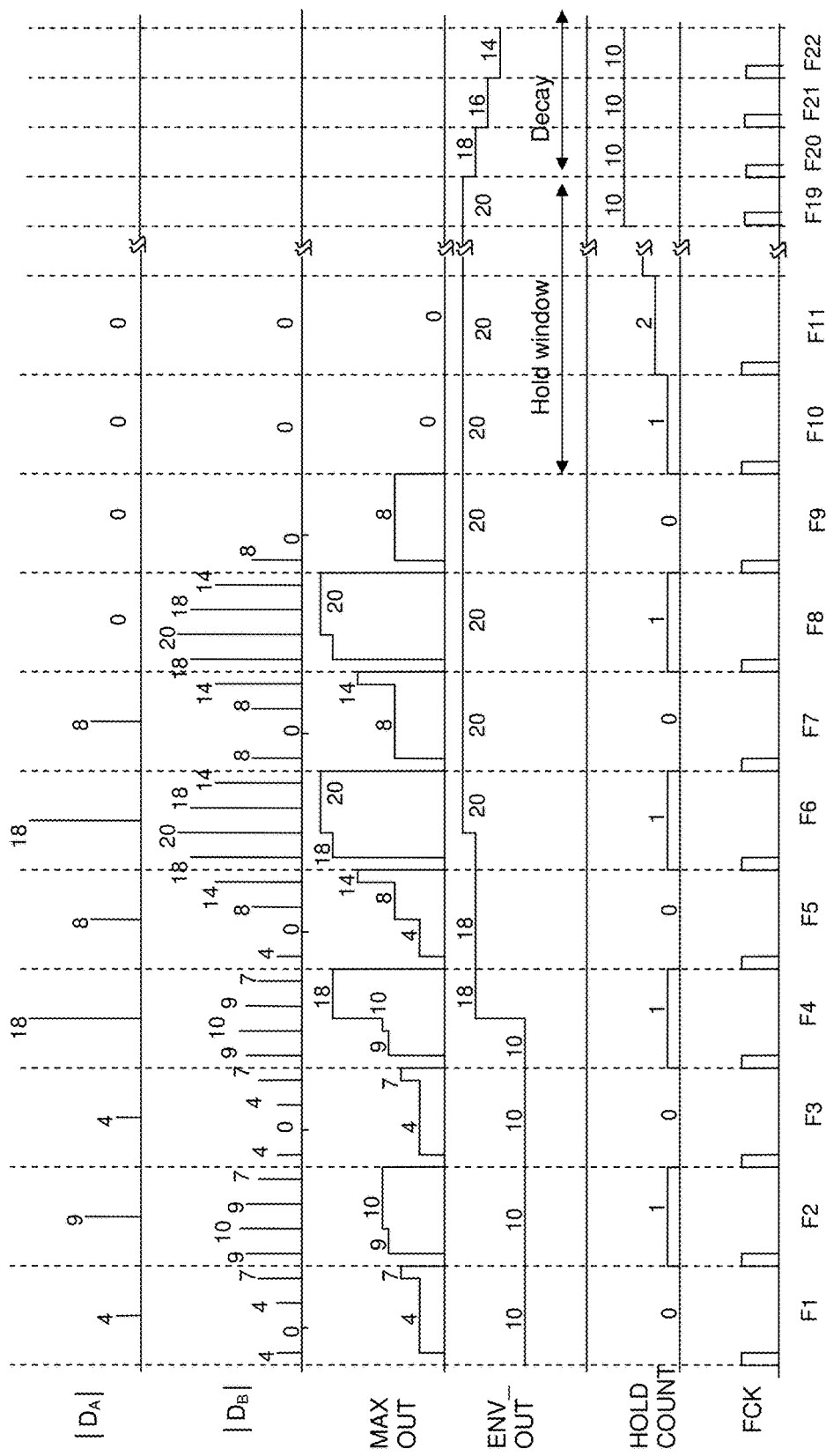
FIG. 5 illustrates waveforms to illustrate the principles of operation of the embodiment of FIG. 4.

FIG. 5 comprises example waveforms to illustrate the principles of operation of the present invention. FIG. 5 illustrates the magnitude values $|D_A|$ of samples $D_A$ received at the first input and the magnitude values $|D_B|$ of samples $D_B$ received at the second input. In this example the second sample rate $n.f_s$ is four (4) times the first sample rate $m.f_s$ so that there are four samples received at the second input for every one received at the first input. In this example the frame clock FCK is running at the first sample rate, i.e. the frame clock rate is equal to $m.f_s$. Thus there is one sample from the first input and four samples from the second input each frame.

FIG. 5 is intended to represent samples from a repeating sinusoidal wave (at a frequency of about $m.f_s/4$) with a relatively constant amplitude that has one cycle of increased amplitude and then drops to zero. This figure is included just to illustrate the principles of the invention so the signal and time values are chosen to illustrate these principles most simply rather than necessarily be representative of typical embodiments.

In a first frame, F1, the first value, i.e. ABSVAL is reset to zero at the start of the frame defined by the leading edge of the frame clock FCK. The ABSVAL value is then increased to represent the running maximum value of all samples received. A sample from the second input with a magnitude value of 4 is the first sample to be received and thus the ABSVAL value is increased to a value of 4 within the frame period. The next sample, also from the second input, has a magnitude of zero and thus the ABSVAL value is maintained at a value of 4. The sample at the first input then arrives and so may be analysed. This sample has a magnitude of 4 so the ABSVAL value is maintained at the value 4. Likewise the next sample from the second input also has a magnitude of 4. The fourth sample from the second input however has a magnitude of 7 and thus the ABSVAL value is increased at this point to 7.

At no point is any sample received with a magnitude greater than the current envelope output value, ENV_OUT, assumed to be 10 as a result of some previous input signals. Thus the envelope output value does not need to be increased.

With regard to the count value FIG. 5 illustrates the approach where at the end of each frame the ABSVAL value is compared to the ENV_OUT value to determine whether to reset or increment the count value and subsequently apply decay processing. For this frame the comparison indicates, as ABSVAL is lower than ENV_OUT, that all samples were lower than envelope output value. As the value of the hold count for that frame was zero the envelope output value is not decreased but the hold count is incremented by one.

At the start of the second frame, F2, the ABSVAL value is reset to zero—although it would be possible to simply use the first sample value of that frame as the initial ABSVAL value for that frame. In this instance the first sample has a value of 9 and the second sample has a value of 10 and so ABSVAL is increased in two steps during the frame. All remaining samples have a lower magnitude and so the final ABSVAL value is 10. Again at no point is there a sample with a greater value that the present ENV_OUT value and hence the envelope output value is not increased. At the end of the frame however the ABSVAL value is compared to the ENV_OUT value and for this frame the ABSVAL value is not lower than the ENV_OUT value. The hold count is thus reset to zero.

Frame F3 is similar to F1. Thus at the end of frame F3 the envelope output value remains with a value 10 and the hold count has again been incremented by 1. In frame F4 however the signal increase has reached the first input. However because of the interpolation delay between the first and second inputs the second input still corresponds to an earlier part of the signal. In the example shown in FIG. 5 the interpolation delay is just under $2/m.f_s$ for ease of illustration (the $D_A$ sample from the first input of frame F1 corresponds to the first of the $D_B$ samples at the second input in the third frame F3). In practice the interpolation delay may be longer for example $5/f_s$ or $10/f_s$.

Thus at the start of frame F4 the ABSVAL value is reset to zero and then increased to 9 and then to 10 as the first two samples at the second input are received. The sample at the first input is then analysed and has a value of 18. The ABSVAL value is increased to 18 during the frame. As this value of ABSVAL is greater than the current envelope output value the attack circuitry acts to increase the envelope output value, ENV_OUT, straightaway.

It can be seen that prior to the signal increase the samples from the first input had a maximum amplitude slightly lower than those of the interpolated signal, maximum value of 9 compared with a maximum of 10 for the interpolated signal. In this steady state case the envelope value was determined by the value of the interpolated signal. However with a sudden increase in amplitude this is indicated by the increased value of the sample at the first input—before the signal increase has yet reached the interpolated signal.

At the end of the frame (F4) the ABSVAL value is compared to the ENV_OUT value and again the ABSVAL value is not lower than the ENV_OUT value so the hold counter is again reset to zero.

In frame F5 the increased signal level is starting to reach the interpolated signal and an ABSVAL value of 14 is reached by the end of the frame. The ENV_OUT value is thus maintained at a value of 18 and the hold count is incremented by 1. In frame F6 the true peak of the signal is reached in the interpolated signal at the second input and a sample value of 20 is received as the second sample in the frame from the second input. At this point the ABSVAL value is increased to 20 and as this is greater than the ENV_OUT value the ENV_OUT value is also increased. At the end of the frame the ABSVAL value is not lower than the ENV_OUT value and thus the hold count is reset to zero.

It can be seen that the envelope output value determined from the samples of the first input slightly was slightly below the peak of the increased signal level; however any control circuitry would at least have had advance warning in frame F4 that the envelope had increased from 10 to 18 and could avoid any gross clipping. The additional increase detected at frame F6 is only an increase from 18 to 20.

In frame F7 an ABSVAL value of 14 is reached at the end of the frame and so the hold count is incremented at the end of the frame. In frame F8 the signal at the first input has dropped to zero but there are still non-zero samples at the second input. In this frame the ABSVAL value reached is equal to the ENV_OUT value and so the hold count is reset.

In frame F9 the samples at the second input also drop to zero, part way through the frame. An ABSVAL value of 8 is reached. It is thus not until the end of frame 10 that a zero value ABSVAL signal would be seen at the end of a frame. At the end of frame F9 the ABSVAL value of 8 is lower than the envelope value and thus the count value is incremented.

In frame 10 the ABSVAL value of zero is again below the ENV_OUT value—however the count value has not yet reached a specified terminal count value. Thus the ENV_OUT value is maintained but the count value incremented again. This continues until a user specified terminal count value is reached. A count of 10 is illustrated in FIG. 5 but in practice a much higher hold count may be required. In frame F19 it can be seen that the count value has just reached 10. At the end of this frame, when the ABSVAL value is again below the ENV_OUT value, the ENV_OUT value may therefore be decreased by a predetermined amount. The ENV_OUT value may then be decreased in further frames until a frame where the ABSVAL value exceed the ENV_OUT value—in which case the ENV_OUT value will be increased and the hold count value reset at the end of the frame. The decrease in ENV_OUT will be configured to provide a desired decay time constant, which may be configurable. FIG. 5 illustrates decreases being applied in successive frames but in practice the decay time constant may mean that decreases occur over several tens or hundreds of frames and there may be a decrease in one frame followed by a plurality of frames maintaining the ENV_OUT value before another decrease.

Figure 6:
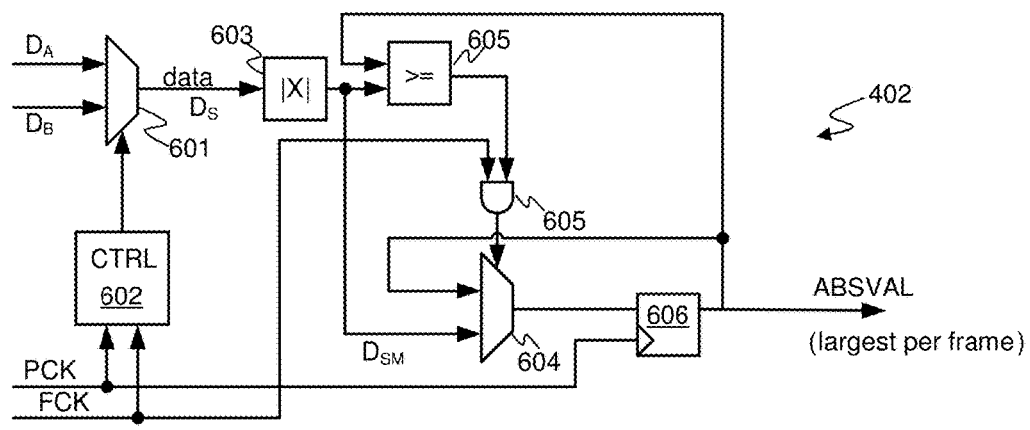
FIG. 6 illustrates an example of an absolute value circuit implementing a maximum value per frame function.

FIG. 6 illustrates one embodiment of suitable absolute value circuitry implementing a maximum value detector for outputting a first value ABSVAL which is a running maximum value over a frame period. Samples from the first and second inputs, $D_A$ and $D_B$ are received by a multiplexer 601 controlled by a controller 602 which receives the frame clock FCK and the fast processor clock PCK. The controller operates the multiplexer to effectively serialise the two different data rate inputs so as to share downstream circuitry. The controller aggregates data from all channels on $D_A$ and $D_B$ into one common data signal $D_S$ input to the abs function block 603. The way in which the controller is configured to operate the multiplexer 601 will depend on when samples are delivered to the data inputs, which will depend in detail on the design chosen for upstream circuitry. FIG. 5 for instance illustrates data samples $D_B$ being received at a regular sample rate with the data $D_A$ being sampled so as to be interspersed with the $D_B$ data and $D_A$ being zero except for one sample per FCK period. Thus, assuming PCK is running at 8 times the frequency of FCK, the controller could merely alternate the multiplexer between $D_A$ and $D_B$ in alternate PCK cycles. But if for example $D_A$ was held constant between updates, and thus straddled the frame clock boundaries, the multiplexer might be adapted and controlled to insert zeros rather than repeated $D_A$ samples. In other embodiments, the $D_A$ sample could be acquired at the start or end of a frame period and/or the $D_B$ samples may be produced in a burst from the interpolation filter, so the controller would need to be configured appropriately. The serialised data samples $D_S$ are received by an absolute value functional block 603 which outputs the magnitude $D_{SM}$ of each sample.

The sample magnitudes $D_{SM}$ are provided to another multiplexer 604 which is controlled by OR gate 605. The OR gate 605 receives the relatively slow frame clock signal FCK so that at the start of each frame multiplexor 604 passes the current sample magnitude (zero in this example, since the first $D_A$ or DB sample has not yet arrived) to the output unit 606 which maintains the first value, ABSVAL, synchronised to the relatively fast processor clock PCK.

For subsequent cycles of the processor clock PCK the multiplexer 604 passes the current first value, ABSVAL, back to the output unit 606 unless comparator 605, which receives both the current sample magnitude $D_{SM}$ and the present first value ABSVAL, determines that the current sample magnitude $D_{SM}$ is greater than (or optionally equal to) the present ABSVAL value.

Figure 7:
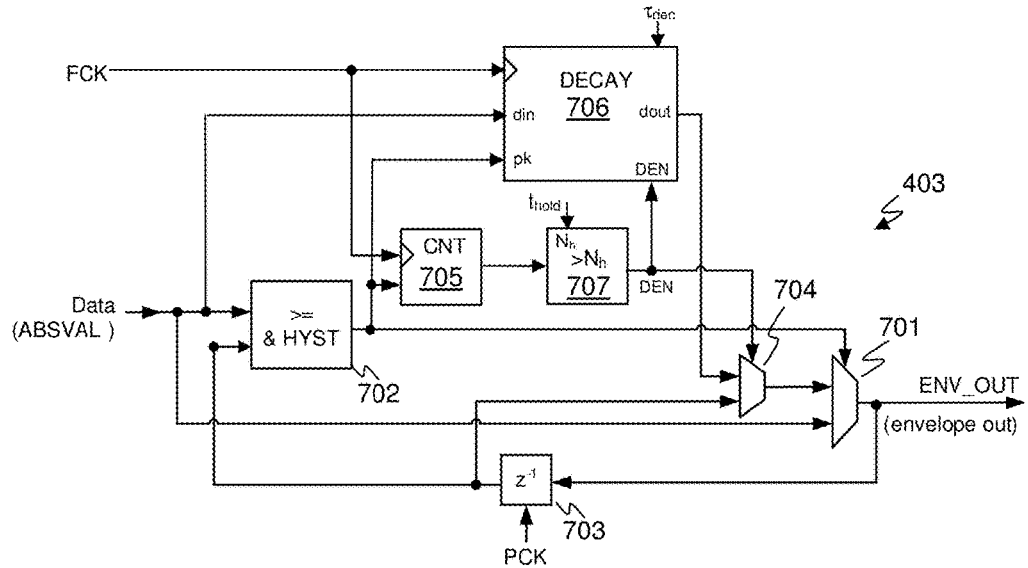
FIG. 7 illustrates an example of an envelope tracker.

FIG. 7 illustrates one possible embodiment of an envelope tracker 403 for acting on the output of an absolute value circuit such as described with reference to FIG. 6. The received first value, indicating the maximum magnitude of any sample so far in the frame, is provided to output multiplexer 701 and also to comparator unit 702. Comparator unit 702 compares, at the processor clock rate, the first value ABSVAL with the envelope output value, ENV_OUT, from one cycle of the PCK clock rate earlier (for synchronisation reasons) provided by hold 703. In the event that the first value exceed the envelope output value the multiplexer 701 is controlled to pass the first value, ABSVAL, to the output as the new envelope output value. This provides the attack circuitry of the envelope tracker and ensures that any increase in first value is passed straight through the envelope tracker. If the first value is not greater than or equal to the held envelope output value this held value is passed back to the output multiplexer via further multiplexer 704. Thus the envelope value output ENV_OUT will remain unchanged.

The decay circuitry comprises hold counter 705, comparator 707 and decay unit 706. The hold counter 705 receives the output from the comparator unit 702 at a reset input and the frame clock FCK at a clock input. The hold counter 705 may be arranged to automatically increment the count value at the frame clock rate. However in the event that a sample having a magnitude greater than the current envelope output value (from one PCK cycle previously) is detected by the comparator unit 702, the counter 705 is reset. The counter may be reset immediately, or in some embodiments the reset signal may be latched and the counter reset at the end of the frame.

The digital comparator 707 outputs a decay-enable signal DEN only when the counter 705 reaches a predetermined count value, which may be set by a configurable $t_{hold}$ setting. In order for DEN to be set there will thus need to have been a specified number of successive frames where the hold counter 705 has not been reset by the comparator unit 702. (Or alternatively, comparator 702 may preset the counter 705 to a similar predetermined count value, and the counter may then be decremented until comparator 707 detects the counter output has become zero, and then outputs the decay-enable signal.)

When generated, the decay-enable signal DEN enables decay unit 706 and controls multiplexer 704 to use the output from the decay unit 706 rather than the recycled ENV_OUT value. The decay unit receives the frame clock FCK and applies a required decay to its output, possibly configured by a decay time constant setting $\tau_{dec}$.

The decay unit 706 also receives an input from comparator 702 and the first value signal ABSVAL: when the comparator detects ABSVAL has exceeded the current ENV_OUT, the decay unit output is set to this new maximum of ABSVAL, so that any later decay starts from the maximum signal received since the last decay event. Again, since ABSVAL maintains a running maximum until the end of the frame, and since the decay processing and hold counter operate at the frame clock rate, ENV_OUT need only be updated at the end of the frame period, avoiding any need for activity earlier in the frame.

In alternative embodiments, especially those in which ASBSVAL is just the absolute value of the current input sample rather than a running maximum, the data input to this decay unit could be connected to the delayed ENV_OUT rather than ABSVAL, as ENV_OUT will have already stored the maximum ABSVAL during the frame if this has exceeded the ENV_OUT at the start of the frame. Depending on the detailed timing of the design, this may impose a minor restriction on the timing of the input samples to the absolute value circuitry: for example this might preclude receiving input samples during the last PCK cycle of a frame to accommodate the PCK delay in the fed-back ENV_OUT signal.

Figure 8:
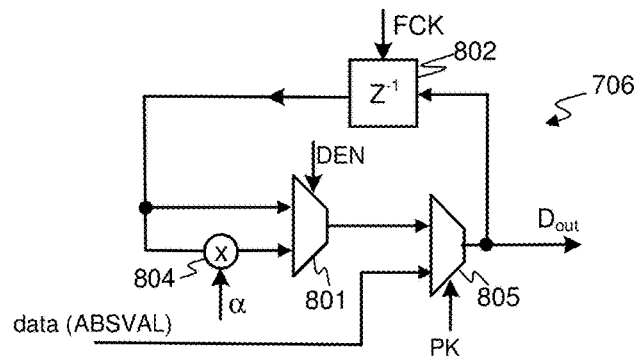
FIG. 8 illustrates an example of a decay unit.

FIG. 8 shows an embodiment of a suitable decay unit 706 although one skilled in the art will appreciate that there are many variants or alternatives that could be used depending on the decay function required. When the input PK from comparator 702 indicates a new maximum input signal has arrived, the output Dout is updated with this new maximum value via multiplexer 805, so any later decay will start from this value. Otherwise, Dout is the output of multiplexer 801.

Unless the decay-enable control signal DEN, from comparator 707, indicates that the required count value has been reached, multiplexer 801 outputs the previous output value stored via one-sample delay 802. Thus the output remains constant. However, when the decay-enable control signal DEN indicates that the required count value has been reached, the other input to multiplexer 801 is passed to the output. This input receives the current envelope output value stored in delay 802 and then scaled by a coefficient a in scaler 804. Over successive frame clock periods, the output signal is thus repeatedly attenuated by successive factors of a. The value of the coefficient a may be configurable to provide a desired decay, and maybe just less than unity, to give a long decay time constant Note that all the decay processing may be implemented at the frame clock rate m.$f_s$. If the hold counter were clocked at n.fs (or even at p.fs) the hold counter would need to be both longer and clocked at the higher frequency, thus consuming more power as well as occupying more chip area. Similarly, the low-pass filter implementing the decay function would need to have a wider data word to maintain the required resolution as well as being clocked at the higher frequency, again consuming more power as well as occupying more chip area The envelope detector may comprise other features. The motivation for Class G and DRE operation is to allow small signals to be reproduced with low power consumption and good signal-to-noise, typically measured over timescales of several seconds. To avoid reacting to say 20 Hz sine-waves that just exceed a threshold envelope value, the hold time $t_{hold}$ may be 25 ms or so, and the decay time constant $\tau_{dec}$ may be similar. Even so, if the envelope of the sine-wave of some audio frequency fluctuates at a slower rate, say with a fluctuation period of a second, there may be unnecessary supply voltage changes of say a Class G power supply. Also, as discussed above, depending on the sampling instants an $f_s/4$ sine wave may be mis-detected by up to 3 dB, so if an incoming sine-wave is say 1 Hz different in frequency from $f_s/4$, there may be a similar modulation in the detected amplitude. To counter this, the comparator unit 702 may also provide hysteresis, which will result in a similar hysteresis in the detected envelope signal ENV_OUT.

Figure 9:
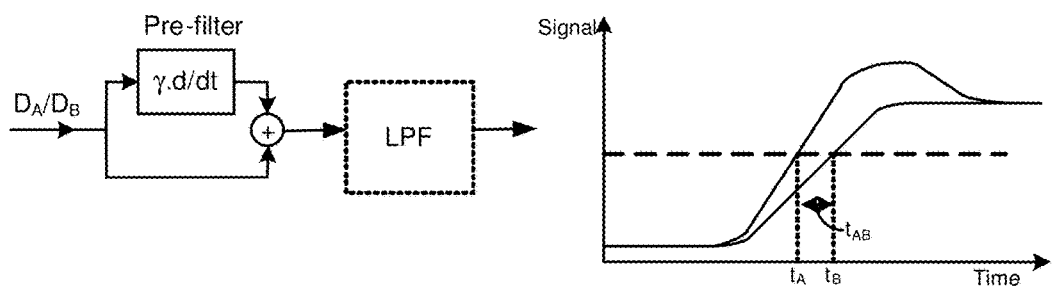
FIG. 9 illustrates pre-emphasis filtering of the input signal.

The signal from at least one of the inputs to the envelope detection circuitry may be filtered by a pre-emphasis filter to accentuate any signal increases. FIG. 9 illustrates an example of such a filter which adds the current sample value to a scaled version of the derivative (i.e. the difference between samples). The filter may also include a low pass filter to avoid excessive gain of high-frequency signals or of high-frequency quantisation noise. The result is that any signal increases are accentuated, as illustrated in the plot of signal against time showing the unfiltered signal and the resulting filter signal for a signal rise. As indicated this means that the filtered signal may increase a given threshold at a time $t_A$ which is earlier than the unfiltered signal at time $t_B$. Pre-emphasis filtering may be applied to the data at both inputs or just one input. For example the data from the first input may be subject to pre-emphasis filtering to give the earliest possible indication of signal rises, and also to compensate for possible apparent signal loss for high frequency components due to the slow sample rate, but no pre-emphasis filtering is applied to the interpolated data at the second input. Alternatively the filtering may be applied just to data from the second input to try and give some phase lead because of the lower propagation delay for such data to the downstream components.

In general embodiments of the present invention relate to methods and circuitry for envelope detection that determine the envelope from a digital data signal both before and after interpolation to provide both early warning of signal rises but also to use interpolated data for a more accurate indication of the actual signal amplitude. The second sample rate (after interpolation) may be at least two times or at least four times higher than the first sample rate. A noted above for a digital signal at a sample rate $f_s$, e.g. an audio sample rate of 48 kHz say, the maximum magnitude sample detected may be up to 3 dB below the actual signal peak (for a signal at a frequency of $f_s/4$). If an interpolated signal at 4.$f_s$ is used the worst error drops to 0.17 dB. Thus a significant improvement in determination of the signal envelope can be achieved by using an interpolated signal which has a sample rate four times greater than signal prior to interpolation.

To provide an interpolation filter function with adequate stop-band attenuation, interpolation from a frequency of $f_s$, such as a typically audio frequency, e.g. 44.1 kHz or 48 kHz, to a frequency of $4.f_s$ may involve an interpolation delay of the order of about $5/f_s$. Thus using the signal prior to interpolation to monitor the signal envelope could provide warning of any significant increases up to $5/f$, in advance of the interpolated signal. In some cases the interpolation may be clocked faster than fs, for instance to allow it to accept data already sampled at say 96 kHz, in which case the filter delay may decrease in proportion: in this mode of operation an additional delay may be deliberately added to maintain an adequate delay.

The envelope detector as described above may therefore form part of a signal processing circuit having a signal path including a first interpolator configured to receive a first digital signal at a first sample rate from an input and interpolate the first digital signal to generate a second digital signal at the second sample rate. The first input of the envelope detector receives the first digital signal and the second input of the envelope detector receives the second digital signal.

For audio applications a digital input signal at a standard audio sample rate, $f_s$, may be received and interpolated up to a sample rate of $64.f_s$ or higher. The envelope detector could therefore receive at the first input an audio signal at a base sample rate, such as a standard audio sample rate, e.g. 44.1 kHz or 48 kHz. The second input to the envelope detector could be the interpolated signal at $64.f_s$. This would however require the envelope detector to be able to handle samples at $64.f_s$. Also the propagation delay from the output of the interpolator to relevant downstream circuitry may be very low. It may therefore be desirable to use an intermediate sample rate.

In some instances the interpolation may be a two stage interpolation with a first interpolator acting on the signal at the standard audio sample rate $f_s$, to interpolate to an intermediate sample rate, say $4f_s$ and a second interpolator acting on the signal at the intermediate sample rate to interpolate the signal to say $64f_s$. In some applications, for instance for Class G type control, where early warning of any signal rises is important the envelope detector may monitor the input signal at the base audio sample rate $f_s$. The second input of the envelope detector may receive the signal at the intermediate sample rate, e.g. $4f_s$. Monitoring this signal will provide improved accuracy, will only require the envelope detector to cope with samples at a rate of $4.f_s$ and there will be some propagation delay in the signal path with the second interpolator.

Thus the envelope detector may receive inputs from before and after a first interpolator and there may be a second interpolator between the first interpolator and downstream components such as a digital-to-analogue converter and possibly an analogue amplifier.

In some applications, such as DRE however it may be desirable to use the fully interpolated signal to be as accurate as possible in setting the gain of the variable gain elements, for example if the interpolation filter is anticipated to provide frequency-dependent amplitude or phase distortion of the applied signal. In which case the envelope detector may receive the same signal as will be subject to the digital gain variation, e.g. the signal at $64f_s$. In this case the input signal at the base sample rate $f_s$ could be used as the other input or the intermediate signal at $4f_s$ could be used. Thus there may be an initial interpolator acting on the signal before the first input to the envelope detector.

It will of course be appreciated that the same principles could be extended to more than two versions of the signal. For instance signals at first, second and third sample rates could be received and processed, for example by combining all three into a serialised data stream and processing as generally described above.

As mentioned the envelope detector of the present invention may be used to control various settings of an audio reproduction circuit such as the supply voltage in class G type operation. Thus there may be a power supply controller responsive to an envelope detector. An envelope detector could also be used for DRE techniques and thus there may be a digital variable gain element for applying a digital gain to the signal received by the digital-to-analogue converter, an analogue variable gain element (possibly implemented by selecting components within the DAC or modulating its reference input) for applying an analogue gain to the first analogue signal produced by the digital-to-analogue converter; and a gain controller for controlling the allocation of gain between the digital variable gain element and the analogue variable gain element based on the envelope output value.

Figure 10:
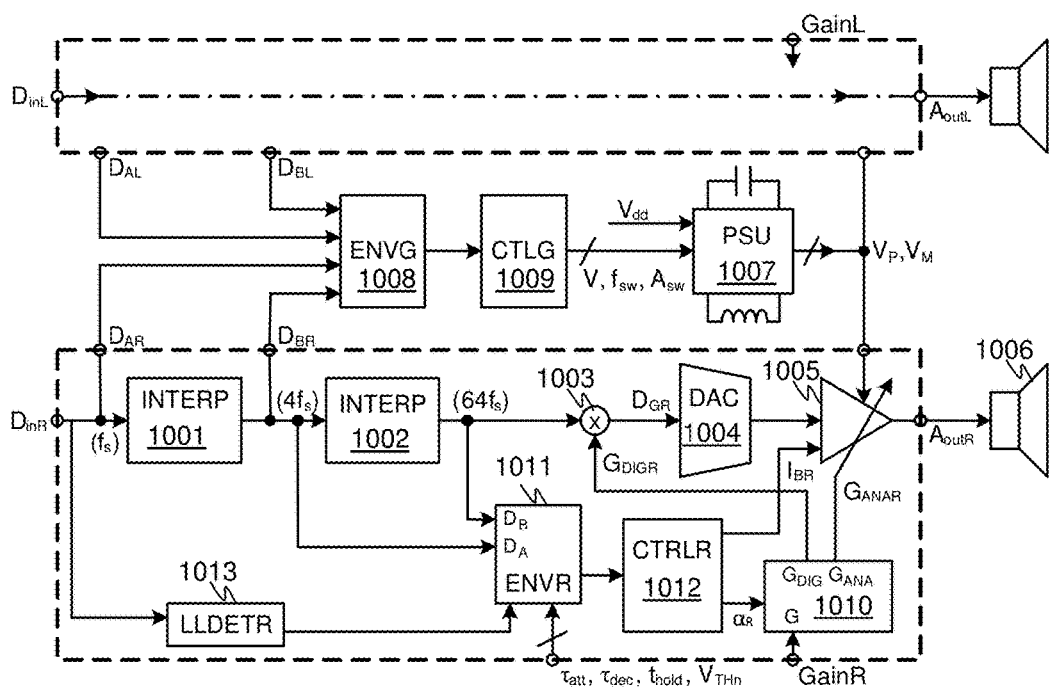
FIG. 10 illustrates an embodiment of an audio reproduction circuit according to an embodiment of the invention.

FIG. 10 illustrates a signal processing circuit having both Class G type control and DRE gain control.

An input digital audio signal at a first sample rate $f_s$ is received at an input $D_{inR}$. As illustrated this may be one channel, e.g. right, of a multi-channel audio output, e.g. stereo. This input digital signal is interpolated by a first interpolator 1001 which interpolates the signal to a second sample rate of, in this example, $4f_s$. A second interpolator 1002 receives the signal from the first interpolator and further interpolates it to a third sample rate, e.g. $64f_s$. The signal at the third sample rate passes through digital gain element 1003 to DAC 1004. The resulting analogue audio signal is amplified by amplifier 1005 and passed to an output which in use may be connected to a loudspeaker 1006.

The amplifier 1005 is supplied with supply voltages by power supply unit 1007, which may for example be a charge pump using switched capacitors or a DC-DC converter using one or more inductors, or possibly some combination thereof. In this example the power supply can generate a variable output voltage and the audio amplifier supply voltage is varied according to the level of the signal to be amplified in accordance with known Class G type operation. An envelope detector 1008 according to an embodiment of the invention is therefore provided to enable the Class G type application.

As the power supply may take some time to increase its output voltage in response to a control request, the envelope detector 1008 receives, as one input $D_{AR}$, the input signal at the first sample frequency. This is the undelayed input audio signal and thus provides the earliest possible warning of any signal amplitude increases. The envelope detector also receives the signal at the second sample rate $4f_s$ to provide a delayed, but more accurate, indication of the signal envelope. This means that the envelope detector 1008 need cope with a maximum sample rate of, in this example, $4f_s$. The detected envelope value is passed to power supply controller 1009 which generates suitable control signals to control the supply voltage of the power supply 1007. In addition the power supply control may also control other aspects of the power supply such as the switching frequency and/or switch size.

In this example the power supply 1007 provides the same supply voltage to both the left and right audio channels. The supply voltage must therefore be sufficient for the maximum signal envelope of either channel. The envelope detector 1008 thus receives samples from the left audio channel in the same fashion. There may be two separate envelope detector circuits, one for the left channel and one from the right channel with a comparator (either in the envelope detector 1008 or the control unit 1009) to determine the maximum envelope value. However in some embodiments all four sample inputs may be provided to the same absolute value circuit which serialises the samples from the four data streams, i.e. from before and after respective interpolation functions applied to each of the left and right data streams. Further embodiments may of course apply the same methods to a greater number of channels, for example to support multi-speaker systems such as 5.1 surround sound.

The embodiment shown in FIG. 10 also includes DRE circuitry to improve noise performance at low signal levels. A gain allocator 1010 therefore adjusts the gain of the digital gain element 1003 to increase digital gain at low signal levels whilst at the same time inversely reducing the analogue gain applied by amplifier 1005. It also applies a delay to the analogue gain to match the delay through the final stages of the digital output path, analogue DAC and headphone amp.

For DRE it may be preferred to use the signal at the third sample rate, i.e. $64f_s$ to determine the appropriate gain setting. Thus a separate envelope detector 1011 according to an embodiment of the invention may be provided which receives, as one input $D_B$, the signal at the high sample rate. It will be appreciated that using this signal means that there is no propagation delay between the output of interpolator 1002 and digital gain element 1003. The envelope detector described above is still advantageous due to the very fast pass through of any increases in signal level. In addition, to get early warning of possible increases the envelope detector also receives the signal at the second sample rate.

The detected envelope value is output to a controller 1012 which determines the appropriate gain setting and controls the gain allocator 1010 accordingly.

The hysteresis, decay and hold time settings for the envelope controller may be configurable and may be set via appropriate controls along with various thresholds. Typically the decay time constant is set relatively high so as to avoid too many gain changes which could lead to audio artefacts being detected. Any artefact associated with an occasional change in gain will normally be masked by the signal. This may not be the case however if the signal has faded to silence or near silence. A low level detector 1013 may therefore monitor for periods of silence and the decay time constant of the envelope detector may be decreased ahead of the arrival of detected silence at the DAC input.

Envelope detection circuits such as described herein may be used in a range of different applications. In particular the envelope detectors may be used in audio amplifier circuits for generating audio signals for driving an audio transducer such as a headphone, headset or earphone, or an on-board transducer or a host device. Embodiments of the invention may be suitable for active noise cancellation circuits. Embodiments of the invention may be may be arranged as part of an audio and/or signal processing circuit, for instance an audio circuit which may be provided in a host device. An envelope detection circuit according to an embodiment may be implemented as an integrated circuit and may be implemented in a host device, especially a portable and/or battery powered host device such as a mobile telephone, an audio player, a video player, a PDA, a mobile computing platform such as a laptop computer or tablet and/or a games device for example.

While the digital signal processing functions have been described above in terms of discrete hardware building blocks, some or all of this functionality may be implemented by more general-purpose programmable processing hardware provided with suitable software.

The skilled person will recognise that at least some aspects of the above-described apparatus and methods may be embodied as processor control code, for example on a non-transitory carrier medium such as a disk, CD- or DVD-ROM, programmed memory such as read only memory (Firmware), or on a data carrier such as an optical or electrical signal carrier. For some applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Additionally the term "gain" does not exclude "attenuation" and vice-versa. Any reference numerals or labels in the claims shall not be construed so as to limit their scope.

What is claimed is:

1. An envelope detection circuit comprising:
    a first input for receiving a first digital signal at a first sample rate;
    a second input for receiving a second digital signal at a second sample rate which is higher than the first sample rate;
    a maximum value detector configured to receive samples from both said first input and said second input and maintain a frame maximum value corresponding to the maximum value of any sample received within a frame period; and
    an envelope tracker configured to receive the frame maximum value and output an envelope output value.

2. An envelope detection circuit as claimed in claim 1 wherein the second digital signal is an interpolated version of the first digital signal.

3. An envelope detection circuitry as claimed in claim 1 wherein the envelope tracker comprises:
    attack circuitry for increasing the envelope output value; and
    decay circuitry for decreasing the envelope output value.

4. An envelope detection circuit as claimed in claim 3 wherein the attack circuitry is configured to detect if the frame maximum value is greater than the envelope output value and, if so, to increase the envelope output value to correspond to the frame maximum value.

5. An envelope detection circuit as claimed in claim 3 wherein the decay circuitry is configured to detect if the frame maximum value is lower than the envelope output value for a predetermined number of successive frame periods and, if so, to decrease the envelope output value.

6. An envelope detection circuit as claimed in claim 3 wherein the attack circuitry operates in response to a first clock signal and the decay circuitry operates in response to a frame clock signal which has a rate slower than the first clock signal.

7. An envelope detection circuit as claimed in claim 1 wherein the maximum value detector is configured such that the frame maximum value is updated at any time in a frame period if a sample with a value greater than the current first value is received during the frame period.

8. An envelope detection circuit as claimed in claim 3 wherein the attack circuitry is configured such that the envelope output value may be updated at any time if the frame maximum value increases to a value greater than the current envelope output value during the frame period.

9. An envelope detection circuit as claimed in claim 8 wherein the attack circuitry is configured such that the envelope output value is only increased if the frame maximum value is greater than the envelope output value by a predetermined amount.

10. An envelope detection circuit as claimed in claim 3 wherein the decay circuitry is configured to compare the frame maximum value at the end of a frame period to the envelope output value so as to detect if the frame maximum value was lower than the envelope output value for that frame period.

11. An envelope detection circuit as claimed in claim 1 wherein the second sample rate is at least two times higher than the first sample rate.

12. An envelope detection circuit as claimed in claim 1 wherein the maximum value detector comprises a multiplexor having inputs coupled to said first and second inputs and configured to produce a data stream consisting of samples received from the first input interspersed with samples received from said second input.

13. An envelope detection circuit as claimed in claim 1 comprising at least one pre-emphasis filter arranged to filter the data signals received at least one of the first and second inputs to emphasize any increase in signal level.

14. A signal processing circuit comprising:
an envelope detection circuit as claimed in claim 1:
a first signal path input for receiving the first digital signal;
a first interpolator configured to interpolate the first digital signal to generate a second digital signal at the second sample rate;
wherein the first input of the envelope detection circuit is configured to receive the first digital signal and the second input of the envelope detector is configured to receive the second digital signal.

15. An electronic device comprising an envelope detection circuit as claimed in claim 1 wherein said device is at least one of: an audio device; a portable device; a communications device; a computing device; a battery powered device; an audio player; a video player; a gaming device; a mobile telephone; a laptop, notebook or tablet computer.

16. An envelope detection circuit comprising:
a first input for receiving a first digital signal at a first sample rate;
a second input for receiving an interpolated version of the first digital signal at a second sample rate which is higher than the first sample rate;
attack circuitry configured to increase an envelope output value if any sample has a value greater than the current envelope output value; and
decay circuitry configured to decrease the envelope output value if no sample has a value greater than the current envelope output value for a predetermined period of time;
wherein the attack circuitry is configured to operate at a first clock speed which is greater than the second sample rate and the decay circuitry is configured to operate at a second clock speed which is slower than the first clock speed.

17. An audio amplifier circuit having a signal path comprising:
a first interpolator configured to receive a digital audio signal and produce an interpolated version at a faster sample rate;
a digital-to-analogue converter downstream in the signal path from the first interpolator;
an analogue amplifier downstream in the signal path from the digital-to-analogue converter;
an envelope detector configured to receive a first signal from the signal path before said first interpolator and a second signal from the signal path before said first interpolator and to produce an envelope value based on the greatest magnitude value of both the first signal and the second signal; and
a controller for controlling at least one setting of at least one component of the amplifier circuit based on said envelope value.

18. An audio amplifier circuit as claimed in claim 17 wherein the envelope detector comprises:
a maximum value detector configured to receive both said first signal and said second signal and maintain a frame maximum value corresponding to the maximum value of any sample of said first or second signal received within a frame period; and
an envelope tracker configured to receive the frame maximum value and output the envelope value.

19. An audio amplifier circuit as claimed in claim 17 wherein said at least one setting comprises at least one of: bias, variable gain setting; switching speed; and switch size.

20. An audio amplifier circuit as claimed in claim 17 comprising a power supply for supplying at least one supply voltage to at least the analogue amplifier wherein said at least one setting comprises at least one of: the supply voltage; the switching speed of the power supply; and the switch size used in the power supply.

* * * * *